US008687665B1

(12) United States Patent
Tauke-Pedretti et al.

(10) Patent No.: US 8,687,665 B1
(45) Date of Patent: Apr. 1, 2014

(54) MUTUALLY INJECTION LOCKED LASERS FOR ENHANCED FREQUENCY RESPONSE

(75) Inventors: Anna Tauke-Pedretti, Albuquerque, NM (US); Erik J. Skogen, Albuquerque, NM (US); Gregory A. Vawter, Corrales, NM (US); Weng W. Chow, Cedar Crest, NM (US)

(73) Assignee: Sandia Corporation, Albuquerque, NM (US)

( * ) Notice: Subject to any disclaimer, the term of this patent is extended or adjusted under 35 U.S.C. 154(b) by 1 day.

(21) Appl. No.: 13/233,221

(22) Filed: Sep. 15, 2011

(51) Int. Cl.
*H01S 3/082* (2006.01)
*H01S 5/00* (2006.01)

(52) U.S. Cl.
USPC ............. 372/97; 372/25; 372/26; 372/29.021

(58) Field of Classification Search
USPC ...................... 372/43.01, 44.01, 50.1–50.124
See application file for complete search history.

(56) References Cited

U.S. PATENT DOCUMENTS

| | | | | |
|---|---|---|---|---|
| 4,734,380 | A * | 3/1988 | Tsang | 372/44.01 |
| 4,896,325 | A * | 1/1990 | Coldren | 372/29.01 |
| 6,043,104 | A * | 3/2000 | Uchida et al. | 372/50.1 |
| 6,141,360 | A * | 10/2000 | Kinugawa et al. | 372/20 |
| 7,103,079 | B2 * | 9/2006 | McInerney et al. | 372/20 |
| 2003/0219045 | A1 * | 11/2003 | Orenstein et al. | 372/20 |
| 2005/0013337 | A1 * | 1/2005 | Jung et al. | 372/50 |
| 2006/0045145 | A1 | 3/2006 | Arahira | |
| 2010/0034223 | A1 | 2/2010 | Osinski | |
| 2010/0135346 | A1 * | 6/2010 | Peters et al. | 372/29.011 |

OTHER PUBLICATIONS

Sung et al., "Modulation Bandwidth Enhancement and Nonlinear Distortion Suppression in Directly Modulated Monolithic Injection-locked DBF Lasers", International Topical Meeting on Microwave Photonics, Sep. 2003, pp. 27-30.
C.J. Chang-Hasnain, "Optically-Injection Locked Tunable Multimode VCSEL for WDM Passive Optical Networks", Nano Optoelectronics Workshop, 2008.
Zhao et al., Modulation Efficiency Enhancement of 1.55 um Injection-Locked VCSELs, Semiconductor Laser Conference, 2006.
Sung et all, Optoetectronic Oscillators Using Direct-Modulated Semiconductor Lasers Under Strong Optical Injection, IEEE Journal of Selected Topics in Quantum Electronics, vol. 15, No. 3, 2009, pp. 572-577.
Chrostowski et al., "Microwave Performance of Optically Injection-Locked VCSELs", IEEE Transactions on Microwave Theory and Techniques, vol. 54, No , Feb. 2006, pp. 788-796.
Bhardwaj at al., "Direct modulation bandwidth enhancement of strongly injection-locked SG-DBR laser", Electronics Letters, vol. 46, No. 5, Mar. 2010, pp. 362-363.

(Continued)

*Primary Examiner* — Armando Rodriguez
*Assistant Examiner* — Sean Hagan
(74) *Attorney, Agent, or Firm* — Martin I. Finston

(57) ABSTRACT

Semiconductor light-emitting devices; methods of forming semi-conductor light emitting devices, and methods of operating semi-conductor light emitting devices are provided. A semiconductor light-emitting device includes a first laser section monolithically integrated with a second laser section on a common substrate. Each laser section has a phase section, a gain section and at least one distributed Bragg reflector (DBR) structure. The first laser section and the second laser section are optically coupled to permit optical feedback therebetween. Each phase section is configured to independently tune a respective one of the first laser section and second laser section relative to each other.

15 Claims, 8 Drawing Sheets

(56) References Cited

OTHER PUBLICATIONS

George et al., "Effects of Direct Current Moduiation on a 60 GHz mm-wave Carrier generated by Master/Slave Optical Sideband Injection Locking", Microwave Photonics, 1999, pp. 65-68.

Hwang et al., "35-GHz Intrinsic Bandwidth for Direct Modulation in 1.3-um Semiconductor Lasers Subject to Strong Injection Locking", IEEE Photonics Technology Letters. vol. 16, No. 4, Apr. 2004, pp. 972-974.

Jin et al., "Microwave Modulation of a Quantum-Well Laser with and without External Optical Injection", IEEE Photonics Technology Letters, vol. 13, No. 7, Jul. 2001, pp. 648-650.

Lau et al., "Bandwidth Enhancement by Master Modulation of Optical Injection-Locked Lasers", Journal of Lightwave Technology, vol. 26, No. 15, Aug. 1, 2008, pp. 2584-2593.

Liu et al., "Modulation Bandwidth, Noise, and Stability of a Semiconductor Laser Subject to Strong Injection Locking", IEEE Photonics Technology Letters, vol. 9, No. 10, Oct. 1997, pp. 1325-1327.

Sung et al., "Optical Properties and Modulation Characteristics of Ultra-Strong Injection-Locked Distributed Feedback Lasers", IEEE Journal of Selected Topics in Quantum Electronics. vol. 13, No. 5 Sep./Oct. 2007, pp. 1215-1221.

Sung et al., "Optical Single Sideband Modulation Using Strong Optical Injection-Locked Semiconductor Lasers", IEEE Photonics Technology Letters, vol. 19, No. 13, Jul. 1, 2007, pp. 1005-1007.

Chow et al., "Modulation Response Improvement With Isolator-Free Injection-Locking", IEEE Photonics Technology Letters, vol. 21, No. 13, Jul. 1, 2009, pp. 839-841.

Chow et al., "Modulation Response in Isolator-Free MOPA and Injection-Locked Laser Configurations", Semiconductor Laser Conference, 2008, pp. 173-174.

Yang et al., "Mechanism for Modulation Response Improvement in Mutually Injection-Locked Semiconductor Lasers", IEEE Journal of Quantum Electronics, vol. 47, No. 3, Mar. 2011, pp. 300-305.

Weng W. Chow, "Theory of emission from an active photonic lattice", Physical Review A 73, 2006, pp. 013821-1-013821-9.

W.W. Chow, "Dynamics in Isolator-Free Injection-Locked Lasers", IEEE/LEOS Winter Topicals Meeting Series, Jan. 12-14, 2009.

Lau et al., "Frequency Response Enhancement of Optical Injection Locked Lasers", IEEE Journal of Quantum Electronics, vol. 44, No. 1, Jan. 2008, pp. 90-99.

Skogen et al., "Monolithically Integrated Active Components: A Quantum-Well Intermixing Approach", IEEE Journal of Selected Topics in Quantum Electronics, vol. 11, No. 2, Mar./Apr. 2005, pp. 343-355.

Skogen et al., "A Quantum-Well-Intermixing Process for Wavelength-Agile Photonic Integrated Circuits", IEEE Journal of Selected Topics in Quantum Electronics, vol. 8, No. 4, Jul./Aug. 2002, pp. 863-869.

Zhao et al., "Novel cascaded injection-locked 1.55 um VCSELs with 66 GHz modulation bandwidth", Optics Express, vol. 15, No. 22, Oct. 2007, pp. 14810-14816.

\* cited by examiner

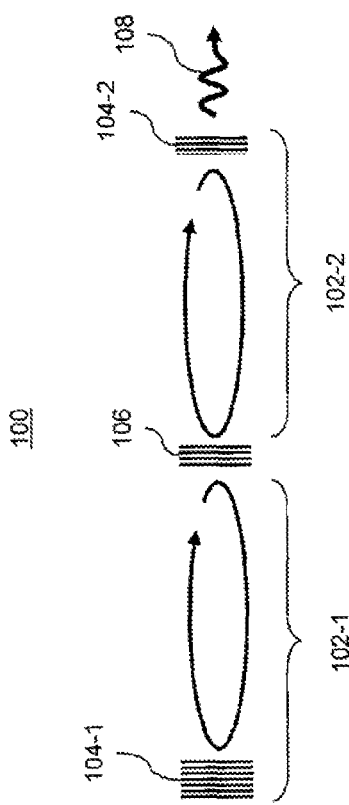
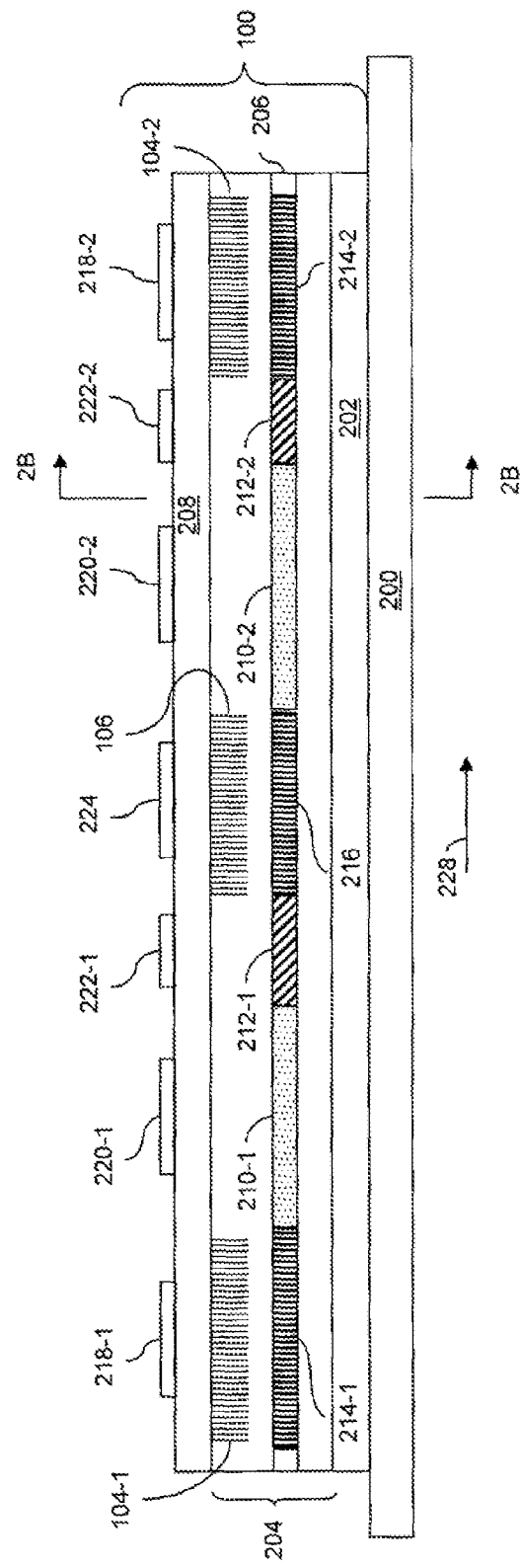

MUTUALLY INJECTION LOCKED LASERS FOR ENHANCED FREQUENCY RESPONSE

STATEMENT REGARDING FEDERALLY SPONSORED RESEARCH

This invention was developed under Contract DE-AC04-94AL85000 between Sandia Corporation and the U.S. Department of Energy. The U.S. Government has certain rights in this invention.

FIELD OF THE INVENTION

The present invention relates to the field of semiconductor light-emitting devices and, more particularly, to monolithically integrated mutually injection-lockable lasers.

BACKGROUND OF THE INVENTION

Semiconductor lasers are known. Because of their spectral and beam properties, as well as their capability to be directly modulated at very high rates, semiconductor lasers have typically been used as components for many optoelectronic applications (e.g., optical telecommunication). Directly modulated lasers, however, typically suffer from high distortion near the resonance frequency. Accordingly, it is desirable to set the laser resonance frequency such that it greatly exceeds a highest desired radio frequency (RF) frequency of a particular application.

In general, the bandwidth of a directly modulated laser is largely defined by the relaxation resonance frequency, which is intimately tied to the photon density in the gain region. It is known to use optical injection locking (OIL) in directly modulated lasers to increase the relaxation resonance frequency, to reduce nonlinear distortion and to reduce frequency chirp. OIL typically uses the output of one laser (master) to optically lock another laser (slave), which may still be directly modulated. OIL may overcome the dependence of the relaxation resonance frequency on gain section current, to produce a significant increase in the resonance frequency (with resonance frequencies as high as about 50 GHz). In general, injecting a laser with a frequency detuned from that laser's optimal frequency may enhance the modulation response by roughly the difference between the two frequencies. Because the bandwidth of directly modulated lasers is largely defined by relaxation resonance frequency, this characteristic of OIL has generated significant interest as it allows directly modulated lasers to achieve much higher bandwidths. For example, OIL has been used in single sideband modulation and optical oscillators.

SUMMARY OF THE INVENTION

One exemplary embodiment of the present invention is a semiconductor light-emitting device. The exemplary semiconductor light-emitting device includes a first laser section monolithically integrated with a second laser section on a common substrate. Each laser section has a phase section, a gain section and at least one distributed Bragg reflector (DBR) structure. The first laser section and the second laser section are optically coupled to permit optical feedback therebetween. Each phase section is configured to independently tune a respective one of the first and second laser sections relative to each other.

Another exemplary embodiment of the present invention is a method of forming a semiconductor light-emitting device. The exemplary method includes forming a waveguide layer on a substrate, where the waveguide layer has an optical region. The method also includes forming a first laser section and a second laser section in the waveguide layer such that the first laser section and the second laser section share the optical region. Each laser section is formed to include a phase section, a gain section and at least one distributed Bragg reflector (DBR) structure. The first laser section and the second laser section are formed to permit optical feedback therebetween. Each phase section is configured to independently tune a respective one of the first and second laser sections relative to each other.

A further exemplary embodiment of the present invention is a method of optical injection locking. The method includes providing a first laser section monolithically integrated with a second laser section on a common substrate. Each laser section has a phase section, a gain section and at least one distributed Bragg reflector (DBR) structure. The method also includes selecting an amount of optical coupling between the first laser section and the second laser section to permit optical feedback therebetween; and applying a bias current to each of the first laser section and the second laser section to establish a mutual injection locking mode, such that one laser section of the first laser section and the second laser section directly modulates the remaining laser section and the remaining laser section emits light. The method further includes independently applying a current to each phase section to modify respective effective cavity lengths of the first laser section and the second laser section relative to each other, for adjusting a resonance frequency of the emitted light.

BRIEF DESCRIPTION OF THE DRAWINGS

The invention may be understood from the following detailed description when read in connection with the accompanying drawing. It is emphasized, according to common practice, that various features of the drawings may not be drawn to scale. On the contrary, the dimensions of the various features may be arbitrarily expanded or reduced for clarity. Moreover, in the drawing, common numerical references are used to represent like features. Included in the drawing are the following figures:

FIG. 1 is a schematic view diagram of an exemplary semiconductor light-emitting device, according to an embodiment of the present invention;

FIG. 2A is a cross-section view diagram of the semiconductor light-emitting device shown in FIG. 1, according to an embodiment of the present invention;

DETAILED DESCRIPTION OF THE INVENTION

Figure 2B:
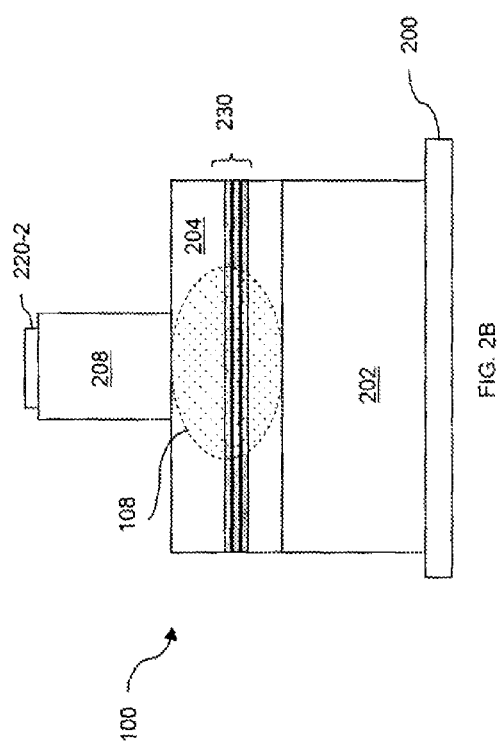
FIG. 2B is a cross-section view diagram of the semiconductor light-emitting device shown in FIG. 2A taken along line 2B-2B, according to an embodiment of the present invention.

Aspects of the present invention relate to semiconductor light-emitting devices having first and second laser sections monolithically integrated on a common substrate. Each laser section may include a phase section, a gain section and at least one DBR structure. The first and second laser sections may be optically coupled to permit optical feedback therebetween. According to an exemplary embodiment, the first and second laser sections may be strongly coupled to each other. Each phase section may be configured to independently tune the first and second laser sections relative to each other, to adjust the resonance frequency of the device.

According to aspects of the present invention, the first and second laser sections may operate in a mutual injection-locking regime, and may produce an increased resonance frequency and increased bandwidth as compared with conventional directly modulated lasers. Because the first and second laser sections may be mutually injection locked, either the first laser section or the second laser section may operate as the master laser, with the remaining laser section operating as the slave laser. According to another embodiment, each of the DBR structures may also be biased, to independently tune the first and second laser sections relative to each other.

According to an exemplary embodiment, the first and second laser sections may include a shared DBR structure therebetween. The shared DBR structure may be configured to control (i.e., modulate) the coupling between the first and second laser sections. According to another exemplary embodiment, the semiconductor light-emitting device may include an electro-absorption modulator (EAM) monolithically integrated between the first and second laser sections. The EAM may be configured to control the coupling between the first and second laser sections.

Conventional OIL lasers are typically formed of multiple discrete components, including circulators, optical fibers and optical isolators, which may be difficult to practically implement for high performance microsystems. Furthermore, because discrete components are used, it may be difficult to control the cavity lengths of the lasers. For example, each component, as well optical fibers connecting the component may be sensitive to changes in temperature. Even very small changes in temperature across the optical fibers may change the effective cavity length by a few hundred angstroms.

According to embodiments of the present invention, first and second lasers sections are monolithically integrated on a common substrate. Monolithic integration of components of an exemplary semiconductor light-emitting device on a single compact chip may include several advantages. For example, the monolithic integration may reduce coupling losses, may increase the mechanical robustness, may produce a smaller form factor and may include an improved compatibility of integration with other elements for the creation of highly functional photonic integrated circuits (PICs).

Referring to FIG. 1, a schematic view diagram of exemplary semiconductor light-emitting device 100 (also referred to herein as device 100) is shown. Device 100 includes first laser section 102-1, second laser section 102-2 and shared DBR structure 106 between first and second laser sections 102-1, 102-2. Each laser section 102-1, 102-2 may include a respective DBR section 104-1, 104-2. As illustrated further below with respect to FIGS. 2A-2C, first laser section 102-1, second laser section 102-2 and shared DBR structure 106 may be monolithically integrated on a common substrate.

Device 100 may desirably include limited, or no, optical isolation between first laser section 102-1 and second laser section 102-2. Accordingly, device 100 may permit optical feedback between first and second laser sections 102-1, 102-2, which may result in an intimate coupling of first and second laser sections 102-1, 102-2. This lack of optical isolation may result in a complex cavity mode structure for laser sections 102-1, 102-2, with modulated light from the slave laser section (for example, second laser section 102-2) also being indicated in the master laser section (for example, first laser section 102-1). In operation, first and second laser sections 102-1, 102-2 may be mutually injection locked by single mode operation, to produce emitted light 108. Because of the coupling between first and second laser sections 102-1, 102-2, any changes to either first laser section 102-1 or second laser section 102-2 may affect the behavior of the entire device 100.

By contrast, in conventional OIL lasers, the master and slave lasers are typically optically isolated from each other. Accordingly, the master laser may be unaffected by changes in the slave laser, with modulation of the slave laser not being indicated in the master laser. Detuning in the conventional OIL laser is typically defined by the free-running wavelengths of the master and slave lasers. Injection locking may be achieved when the slave lases at the wavelength of the master laser.

Figure 2C:
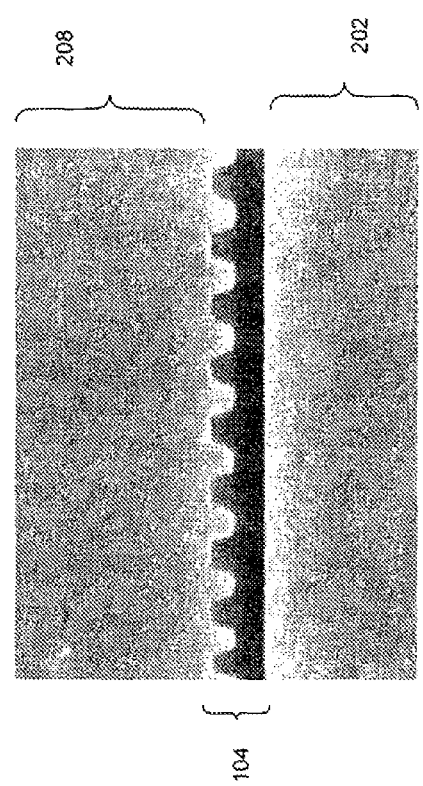
FIG. 2C is a micrograph of an exemplary distributed Bragg reflector (DBR) portion of the semiconductor light-emitting device shown in FIG. 2A, according to an embodiment of the present invention.

Referring to FIGS. 2A-2C, an example monolithic integration of first and second laser sections 102-1, 102-2 and shared DBR structure 106 on common substrate 200 is shown. In particular, FIG. 2A is a cross-section view diagram of the device 100 with respect to the light propagation direction (indicated by arrow 228); FIG. 2B is a cross-section view diagram of device 100 taken along line 2B-2B; and FIG. 2C is a micrograph of an example DBR structure 104 (or shared DBR structure 106) of device 100.

As shown in FIG. 2A, device 100 may include waveguide layer 204 having optical region 206 disposed between bottom cladding layer 202 and top cladding layer 208. Device 100 may include independent electrical contacts 218, 220, 222, 224 (such as p-type contacts) disposed on top cladding layer 208, to apply respective currents (or voltages) to various sections of device 100.

Although not shown, additional electrical contacts (such as n-type contacts) may be disposed, for example, below substrate 200, where top electrical contacts 218, 220, 222, 224 and corresponding bottom electrical contacts may be used for control of device 100 during its operation. Electrical contacts 218, 220, 222, 224 (and additional bottom electrical contacts) may be formed from any suitable material including, but not limited to, Cu, Ag, Al, W, Ti, Pt, Au, Ge, Ni, or combinations thereof.

As shown in FIG. 2B, the cross-section of device 100 (perpendicular to propagation direction 228 shown in FIG. 2A) indicates that device 100 may be formed as a ridge waveguide structure. In an exemplary embodiment, an active region 230 (such as corresponding to gain sections 210) of optical region 206 includes a plurality of quantum well layers. An active-passive interface of optical region 206 may be defined using quantum well intermixing (QWI), which may allow the tailoring of the quantum well band edge with very low optical reflections. Although in an exemplary embodiment, active region 230 includes a plurality of quantum well layers, active region 230 may include at least one quantum well layer, a plurality of quantum dots, or a single bulk active layer.

In an exemplary embodiment, cladding layers 202, 208 are respectively formed from n-type InP and p-type InP, and waveguide layer 204 is formed from InGaAsP. In general, suitable materials for forming waveguide layer 204 may include, without being limited to, various III/V materials, such as InAs, InGaAs and InGaAsP, as well as type IV materials and II/VI materials used in electro-optical devices. Although an n-type bottom cladding layer 202 and a p-type top cladding layer 208 are described, it is understood that device 100 may include a p-type bottom cladding layer 202 and an n-type top cladding layer 208. The vertical structure shown in FIG. 2B, thus, is a PIN diode.

Referring back to FIG. 2A, waveguide layer 204 may include first DBR section 214-1, first gain section 210-1, first phase section 212-1, shared DBR section 216, second gain section 210-2, second phase section 212-2 and second DBR section 214-2. First DBR section 214-1, first gain section 210-1 and first phase section 212-1 correspond to first laser section 102-1 (FIG. 1). Second gain section 210-2, second phase section 212-2 and second DBR section 214-2 correspond to second laser section 102-2 (FIG. 1). Although gain sections 210 and phase sections 212 are illustrated as being positioned in the order shown in FIG. 2A, it is understood that the order of one or more of gain sections 210 and phase sections 212 may be reversed.

DBR sections 214, shared DBR section 216 and phase sections 212 may be formed from a passive waveguide portion of optical region 206. As discussed above, gain sections 210 may be formed from active region 230 (FIG. 2B) of optical region 206.

Each of DBR sections 214, gain sections 210, phase sections 212, and shared DBR section 216 may be respectively arranged in series along light propagation direction 228, so that all of these sections are part of a single ridge waveguide structure and may, thus, share the same optical region 206. Accordingly, all of the sections (i.e., DBR sections 214, gain sections 210, phase sections 212, and shared DBR section 216) may be monolithically integrated together as device 100 and formed on common substrate 200.

Gain sections 210-1, 210-2 represents areas where current may be injected (via electrical respective electrical contacts 220-1, 220-2) to achieve amplification and emission of light within optical region 206. A cavity length of each gain section 210-1, 210-2 (as well as reflection coefficients of DBR structure 104 and shared DBR structure 106) may be selected for a desired locking modulation bandwidth. According to an exemplary embodiment, gain section 210-1 is about 500 μm in length and gain section 210-2 is about 200 μm in length.

Phase sections 212 represent areas which may be electrically biased. For example, a respective current or voltage (via electrical respective electrical contacts 222-1, 222-2) may be applied to phase sections 212-1, 212-2. The applied electrical bias may change the index of refraction of the corresponding optical region 206, which may change the effective cavity length. Thus, by changing the effective cavity length, phase sections may tune the wavelength of respective laser sections 102-1, 102-2 (FIG. 1).

Each phase section 212-1, 212-2 may be independently tuned (to change the respective effective cavity length of the corresponding laser section 102 (FIG. 1)). Because first and second laser sections 102-1, 102-2 (FIG. 1) are coupled to each other, the tuning of one laser section (for example, first laser section 102-1) may change the wavelength of the remaining laser section (for example, second laser section 102-2). Accordingly, the independent tuning of each phase section 212-1, 212-2 may tune first and second laser sections 102-1, 102-2 (FIG. 1) relative to each other.

Furthermore, because first and second laser sections 102-1, 102-2 (FIG. 1) are coupled to each other, device 100 includes three active cavities. A first cavity corresponds to the portion of optical region 206 between DBR section 214-1 and shared DBR section 216. A second cavity corresponds to the portion of optical region 206 between shared DBR section 216 and DBR section 214-2. A third cavity corresponds to the portion of optical region 206 between DBR section 214-1 and DBR section 214-2. Accordingly, the independent tuning of each phase section 212-1, 212-2 may tune each of these three cavities relative to each other (to change each cavity mode spacing relative to each other and change the resonance frequency).

Each of DBR sections 214 and shared DBR section 216 are configured by respective DBR structures 104 and shared DBR structure 106 to produce a desired amount of reflectivity. In general, DBR structures 104 and shared DBR structure 106 represent light-reflecting structures based on Bragg reflection at a periodic structure. Each of DBR structures 104 and shared DBR structure 106 may represent a corrugated waveguide structure (i.e., a grating section). Referring to FIG. 2C, a micrograph is shown of an example DBR structure 104 (or shared DBR structure 106), according to an exemplary embodiment of the present invention. In general, a length of the grating may be selected to provide the desired amount of reflectivity. For example, a longer grating section may produce a higher reflectivity coefficient. According to an exemplary embodiment, reflectivities of DBR structure 104-1, shared DBR structure 106 and DBR structure 104-2 are selected as 99%, 45% and 90%, respectively.

DBR structures 104 and shared DBR structure 106 may provide wavelength-dependent feedback to define the photon density and the respective emission wavelengths for gain sections 210-1, 210-2. Shared DBR structure 106 may also determine the amount of coupling between first and second laser sections 102-1, 102-2 (FIG. 1). In addition, the refractive index of each DBR structure 104-1, 104-2 and shared DBR structure 106 may be independently changed (via respective electrical contacts 218-1, 218-2 and 224), to provide additional tuning of respective laser sections 102-1, 102-2 (FIG. 1).

Although either one of laser sections 102-1, 102-2 (FIG. 1) may operate as the master laser, the length of one of DBR structures 104 (for example DBR structure 104-1) may be selected to be longer than the length of the other DBR structure 104 (for example, DBR structure 104-2). In this example, first laser section 102-1 (FIG. 1) may operate at a higher photon density (similar to a master laser) than second laser section 102-2 (which would operate similarly to a slave laser).

In operation, first and second laser sections 102-1, 102-2 (FIG. 1), may be biased at a point of mutual injection locking, with one of gain sections 210-1, 210-2 being modulated. Device 100, operating in the mutual injection locking regime, may produce resonances in the frequency response. The frequency and damping of these resonances may be controlled through currents applied to gain sections 210, phase sections 212, DBR structures 104 and shared DBR structure 106 via respective electrical contacts 220, 222, 218 and 224. In general, device 100 may produce a resonance frequency that is about ten times the free running relaxation resonance frequency, where the resonance frequency may be dependent on the relative cavity detuning of first and second laser sections 102-1, 102-2.

Figure 3:
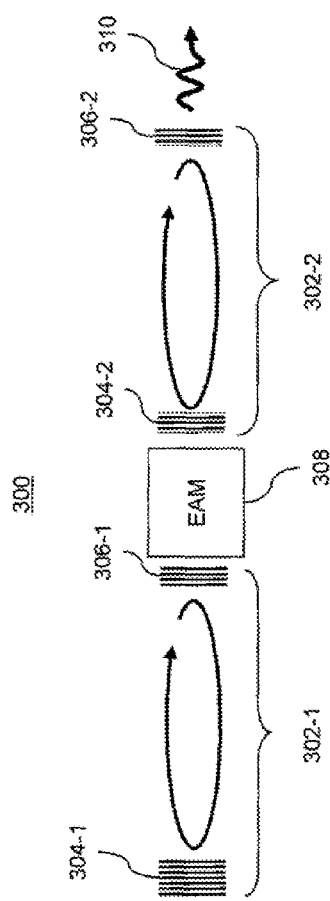
FIG. 3 is a schematic view diagram of an exemplary semiconductor light-emitting device, according to another embodiment of the present invention.

Referring to FIG. 3, a schematic view diagram of exemplary semiconductor light-emitting device 300 (referred to herein as device 300) is shown. Device 300 includes first laser section 302-1, second laser section 302-2 and electro-absorption modulator (EAM) 308 between first and second laser sections 302-1, 302-2. Each laser section 302 may include first DBR section 304 and second DBR section 306. As illustrated further below with respect to FIG. 4, first laser section 302-1, second laser section 302-2 and EAM 308 may be monolithically integrated on a common substrate. Device 300 is similar to device 100 (FIG. 1), except that each laser section 302 includes two DBR sections 304, 306 and device 300 includes EAM 308 (instead of shared DBR structure 106).

Similar to device 100 (FIG. 1), device 300 may include limited, or no, optical isolation between first laser section 302-1 and second laser section 302-2. Accordingly, device 300 may permit optical feedback between first and second laser sections 302-1, 302-2, which may result in an intimate coupling of first and second laser sections 102-1, 102-2. In operation, first and second laser sections 302-1, 302-2 may be mutually injection locked by single mode operation, to produce emitted light 310.

Figure 4:
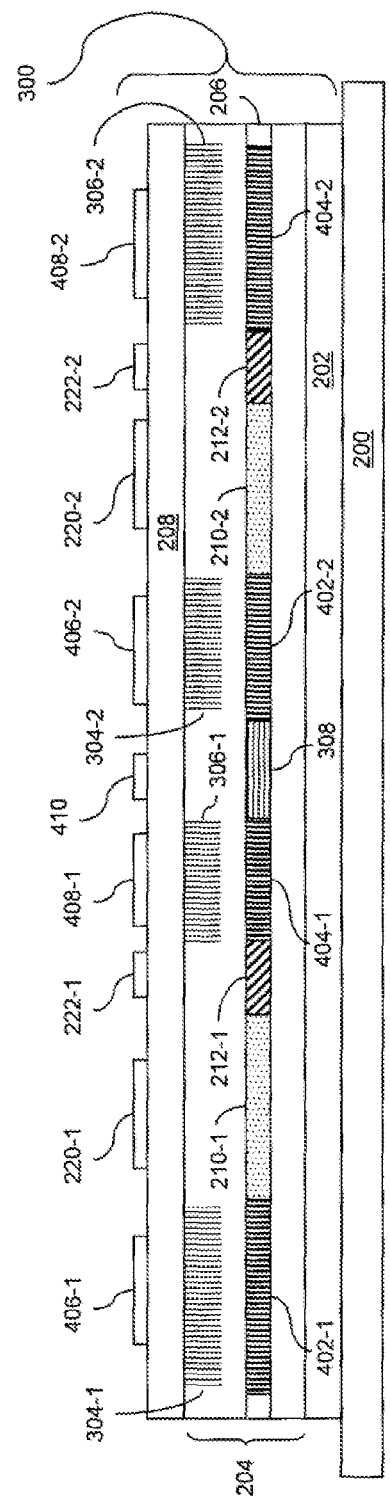
FIG. 4 is a cross-section view diagram of the semiconductor light-emitting device shown in FIG. 3, according to an embodiment of the present invention.

Referring to FIG. 4, the monolithic integration of first and second laser sections 302-1, 302-2 and EAM 308 on common substrate 200 is shown. Similar to device 100 (FIG. 1), device 300 may include waveguide layer 204 having optical region 206 disposed between bottom cladding layer 202 and top cladding layer 208. Device 300 may include independent electrical contacts 220, 222, 406, 408, 410 (such as p-type contacts) disposed on top cladding layer 208, to apply respective currents or voltages to various sections of device 300. Although not shown, additional electrical contacts (such as n-type contacts) may be disposed, for example, below substrate 200, where top electrical contacts 220, 222, 406, 408, 410 and corresponding bottom electrical contacts may be used for control of device 300 during its operation.

For device 300, waveguide layer 204 may include first DBR section 402-1, first gain section 210-1, first phase section 212-1, second DBR section 404-1, EAM 308, third DBR section 402-2, second gain section 210-2, second phase section 212-2 and fourth DBR section 404-2. First DBR section 402-1, first gain section 210-1, first phase section 212-1 and second DBR section 404-1 correspond to first laser section 302-1 (FIG. 3). Third DBR section 402-2, second gain section 210-2, second phase section 212-2 and fourth DBR section 404-2 correspond to second laser section 302-2 (FIG. 3). Although gain sections 210 and phase sections 212 are illustrated as Deing positioned in the order shown in FIG. 4, it is understood that the order of one or more of gain sections 210 and phase sections 212 may be reversed.

Because first and second laser sections 302-1, 302-2 (FIG. 3) are coupled to each other, device 300 includes at least five active cavities. A first cavity corresponds to the portion of optical region 206 between first and second DBR sections 402-1 and 404-1. A second cavity corresponds to the portion of optical region 206 between third and fourth DBR sections 402-2 and 404-2. A third cavity corresponds to the portion of optical region 206 between first DBR section 402-1 and third DBR-section 402-2. A fourth cavity corresponds to the portion of optical region 206 between second DBR section 404-1 and fourth DBR section 404-2. A fifth cavity corresponds to the portion of optical region 206 between first DBR section 402-1 and fourth DBR section 404-2. Accordingly, the independent tuning of each phase section 212-1, 212-2 (via respective electrical contacts 222-1, 222-2) may tune each of these five cavities relative to each other (to change each cavity mode spacing relative to each other and change the location of the resonance frequency).

DBR sections 402, 404 and phase sections 212 may be formed from a passive waveguide portion of optical region 206. Gain sections 210 may be formed from active region 230 (FIG. 2B) of optical region 206. EAM 308 may be formed from an intermediate region of optical region 206. The intermediate region may be similar to active region 230, except that, for the intermediate region, the energy of the quantum well quantized energy states or the absorption band edge may be different from active region 230.

DBR sections 402 and 404 are similar to DBR sections 214 (FIG. 2A) and are configured by respective DBR structures 304, 306 to produce a desired amount of reflectivity. DBR structures 304, 306 may represent a corrugated waveguide structure (i.e., a grating section), similar to the grating section illustrated in FIG. 2C. In addition, the refractive index of each DBR structure 304-1, 304-2, 306-1, 306-2 may be independently changed (via electrical respective electrical contacts 406-1, 406-2, 408-1, 408-2), to provide additional tuning of respective laser sections 302-1, 302-2 (FIG. 3). According to an exemplary embodiment, reflectivities of first DBR structure 304-1, second DBR structure 306-1, first DBR structure 304-2 and second DBR structure 306-2 are selected as 99%, 55%, 55% and 90%, respectively.

EAM 308 may be configured to modulate the coupling between first and second laser sections 302-1, 302-2 (FIG. 3). EAM 308 may operate based on the Franz-Keldysh effect, where the effective bandgap of a semiconductor decreases with increasing electric field. EAM 308 may modulate the intensity of photons transferred between first and second laser sections 302-1, 302-2 (FIG. 3), by application of a voltage to electrical contact 410 (and a corresponding bottom contact). In this case, EAM 308 may be modulated to produce a flatter frequency response across the bandwidth of device 300, and may also increase the modulation efficiency of the device.

In a conventional laser, an EAM may be placed at the output of the laser, to control (modulate) the intensity of emitted light 310 (FIG. 3) via a bias voltage. In contrast, in device 300, EAM 308 may be configured to modulate the coupling of photons between first and second laser sections 302-1, 302-2 (FIG. 3).

Figure 10:
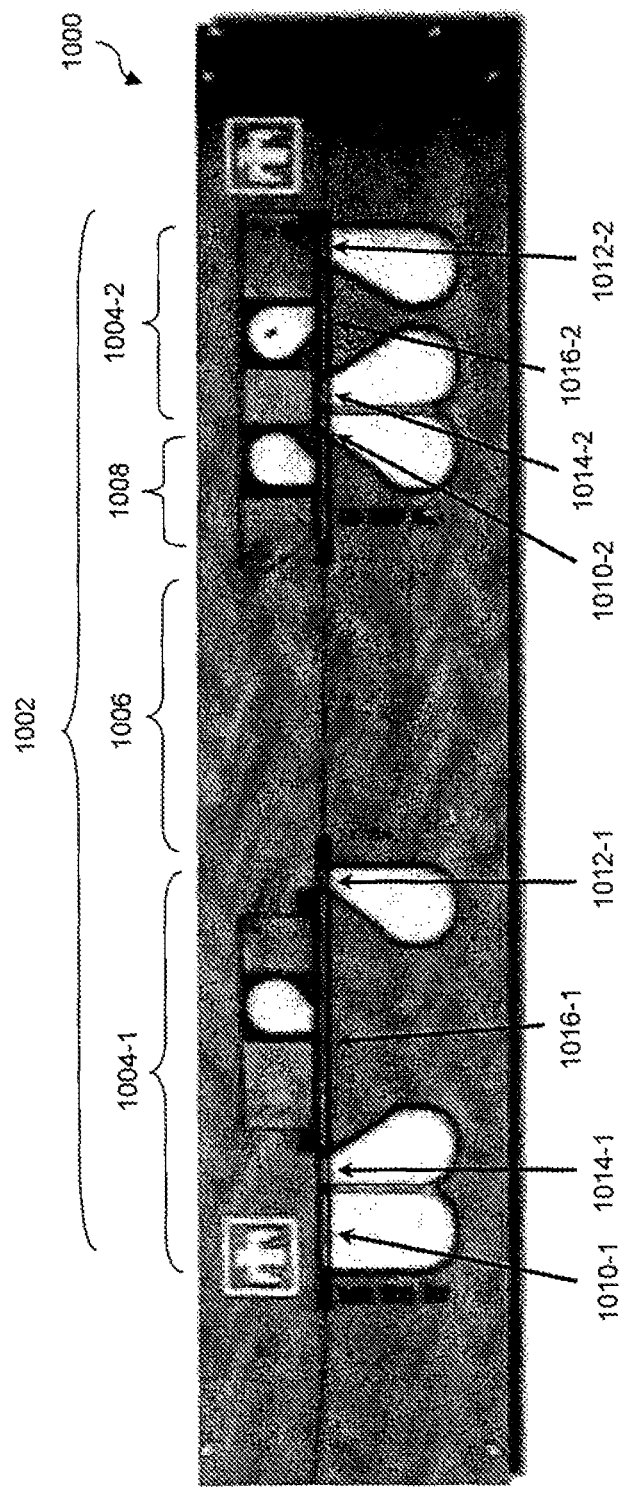
FIG. 10 is a micrograph illustrating an overhead view of an exemplary semiconductor light-emitting device, according to an embodiment of the present invention.

Although FIG. 4 illustrates EAM 308 directly coupled to each of second DBR structure 306-1 and first DBR structure 304-2, device 300 may include a passive waveguide structure between EAM 308 and one of laser sections 302-1 or 302-2 (FIG. 3). For example, FIG. 10 illustrates waveguide structure 1006 between first laser section 10004-1 and second laser section 1004-2.

In operation, first and second laser sections 302-1, 302-2 (FIG. 3), may be biased at a point of mutual injection locking, with one of gain sections 210-1, 210-2 being modulated (via one of electrical contact 220-1, 220-2) and EAM 308 being modulated (via electrical contact 410). In device 300, the modal spacing (determined by both laser sections 302-1, 302-2) may be used to control the resonance frequencies of the emitted light. The cavity mode locations may be controlled through currents applied to phase sections 212 and DBR structures 304, 306 via respective electrical contacts 222, 406 and 408.

Referring back to FIGS. 2A and 2B, an exemplary method of fabricating device 100 is described, according to an embodiment of the present invention. According to an exemplary embodiment, metal-organic chemical vapor deposition (MOCVD) may be used to grow an epitaxial base structure for fabrication of device 100. Other suitable epitaxial growth techniques may include, without being limited to, metal-organic vapor-phase epitaxy (MOVPE) or molecular beam epitaxy (MBE).

Bottom cladding layer 202 having suitable doping concentration (for example, n-type) may be grown or otherwise formed on substrate 200. Waveguide layer 204 having optical region 206 may be grown on bottom cladding layer 202. Gain sections 210-1, 210-2 having active regions 230 (such as multiple quantum wells) may be defined in portions of optical region 206, according to respective cavity lengths for achieving a desired modulation bandwidth. For example, gain sections 210-1, 210-2 may be formed by CVD or MBE. Phase sections 212-1, 212-2 may also be defined in passive waveguide portions of optical region 206. DBR structures 104-1, 104-2 and shared DBR structure 106 may be defined and etched in passive waveguide portions (respective DBR sections 214-1, 214-2 and 216) of optical region 206. According to another embodiment, DBR structures 104-1, 104-2 and shared DBR structure 106 may be formed in bottom cladding layer 202 (and/or top cladding layer 208). As discussed above, a length of each DBR structure 104-1, 104-2 and shared DBR structure 106 may be selected to provide a desired reflectivity, for defining the emission wavelengths of first and second laser sections 102-1, 102-2 (FIG. 1) and for a desired coupling (by shared DBR structure 106) between laser sections 102-1, 102-2.

In an exemplary embodiment, active regions 230 having seven quantum wells centered in a InGaAsP waveguide layer may be grown on a conducting sulfur-doped InP substrate. The active-passive interface may be defined using a quantum well intermixing (QWI) technique. The QWI may provide for tailoring of the quantum well band edge with very low optical reflections, allowing the integration of different functionalities on the chip. Waveguide layer 204 may include active regions 230 for gain sections 210 and passive regions with a fully blue-shifted band-edge (of about 100 nm) for phase sections 212, DBR sections 214 and shared DBR section 216. DBR structures 104 and shared DBR structure 106 may be defined with e-beam lithography and dry etched into waveguide layer 204.

Top cladding layer 208 having a suitable doping concentration (for example, p-type) may be grown on waveguide layer 204. A suitably doped contact layer, for example, p++, (not shown) may also be formed on top cladding layer 208. Electrical contacts 218, 220, 222 and 224 may be formed on the contact layer (above top cladding layer 208). Additional electrical contacts (not shown) may also be formed below substrate 200 corresponding to top electrical contacts 218, 220, 222, 224.

In an exemplary embodiment, there is a single planar MOCVD regrowth of an InP p-type top cladding layer 208 and a p-doped InGaAs contact layer. Topside p++ type contacts 218, 220, 222 and 224, designed for high-speed probing, may be formed using dry etching, metal deposition and annealing. Bis-benzocyclobutene (BCB) may be used as a low-k dielectric under p-type contact pads to reduce the capacitance and isolate the n-metal and p-metal layers. A proton implant may be used to isolate the p-type contacts of the laser sections. After lapping and cleaving, a single layer anti-reflection coating may be used to suppress facet back reflections.

Referring to FIG. 4, device 300 may be fabricated similarly to device 100 (FIG. 2A). Gain sections 210, phase sections 212 and DBR sections 402, 404 of waveguide layer 204 may be fabricated as described above with respect to device 100 (FIG. 2A). In addition, waveguide layer 204 may be fabricated to define EAM 308 in a portion of optical region 206. EAM 308 may be defined with a plurality of quantum wells as part of an intermediate region of optical region 206. In an exemplary embodiment, the intermediate region of optical region 206 may be defined with a slightly blue-shifted band-edge of about 50 nm.

The invention will next be illustrated by reference to two examples. The examples are included to more clearly demonstrate the overall nature of the invention. These examples are exemplary, not restrictive of the invention.

Example 1

Figure 5:
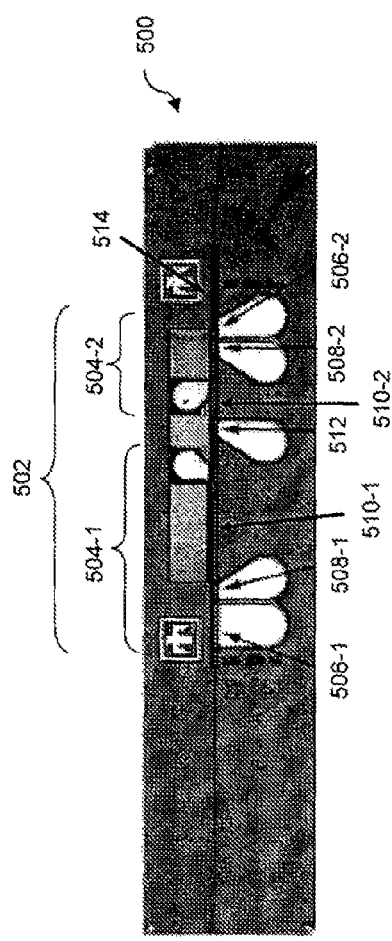
FIG. 5 is a micrograph illustrating an overhead view of an exemplary semiconductor light-emitting device, according to an embodiment of the present invention.

Referring to FIG. 5, a micrograph is shown of example semiconductor light-emitting device 502 (referred to herein as device 502) of photonic integrated circuit (PIC) 500. Device 502 is similar to device 100 (FIGS. 1 and 2A). Device 502 represents a coupled-cavity device having two DBR lasers (first and second lasers 504-1, 504-2) sharing a center mirror 512. Although there are not clearly defined master and slave lasers due to coupling between the lasers, for reference purposes the laser nearest the output (laser 504-2) will be referred to as the slave and the back laser (laser 504-1) will be referred to as the master.

The example slave laser 504-2 consists of a 58 µm long front DBR mirror 506-2, a 50 µm long phase section 508-2, a 200 µM long gain section 510-2 and a 45 µm long rear DBR mirror (shared mirror 512). The rear mirror 512 of the slave laser 504-2 is shared between the two lasers 504-1, 504-2 and also acts as the front mirror for the master laser 504-1. The example master laser 504-1 consists of the shared DBR mirror 512, a 500 µm long gain section 510-1, a 50 µm long phase section 508-1 and a 150 µm long rear DBR mirror 506-1. The DBR mirrors are designed for effective power reflectivities of 90%, 45% and 99% for the slave front mirror 506-2, shared mirror 512 and master rear mirror 506-1, respectively. The example ridge waveguide is 4 µm wide with a curved and flared output 514 to reduce back reflections and improve coupling efficiency to a fiber.

Metal-organic chemical vapor deposition (MOCVD) is used to grow epitaxial base structure for this chip 500. Chip 500 includes seven quantum wells in an active region centered in an InGaAsP waveguide layer grown on a conducting sulfur-doped InP substrate. The active-passive interface is defined using a quantum well intermixing technique, which allows the tailoring of the quantum well band edge with very low optical reflections. Following the definition of the DBR gratings for the mirrors, there is a single planar MOCVD regrowth of the InP p-cladding and p-doped InGaAs contact layer. Topside n-contacts, designed for high-speed probing, are formed using dry etching, metal deposition and annealing. Bis-benzocyclobutene (BCB) is used as a low-k dielectric under the p-contact pads to reduce the capacitance and isolate the n-metal and p-metal. A proton implant is used to isolate the p-contacts of the laser sections. After lapping and cleaving, a single layer anti-reflection coating is used to suppress facet back reflections. The device is soldered to copper submounts. The DC (direct current) contacts are wirebonded to an AlN standoff and the high-speed laser gain sections are directly probed using a ground-signal-ground high-speed probe for testing.

As a reference, the frequency response of the slave laser 504-2 under external injection may be determined for varying detuning wavelengths. Light from a tunable external cavity laser (not shown) is coupled into the cavity of slave laser 504-2. A circulator (not shown) is used to separate the laser output light from the injected light. The output of the modulated slave laser 504-2 is input into a photodiode (not shown) and then port 2 of a network analyzer (not shown). The master laser gain section 510-1 is reverse biased to −4 V, rendering it effectively an absorber. In this configuration the slave laser 504-2 is acting as a true slave laser and the external cavity laser is the injection locking master laser. The level of injected power into the laser cavity is measured by reverse biasing the slave laser gain section to −4 V and recording the measured photocurrent.

Figure 6:
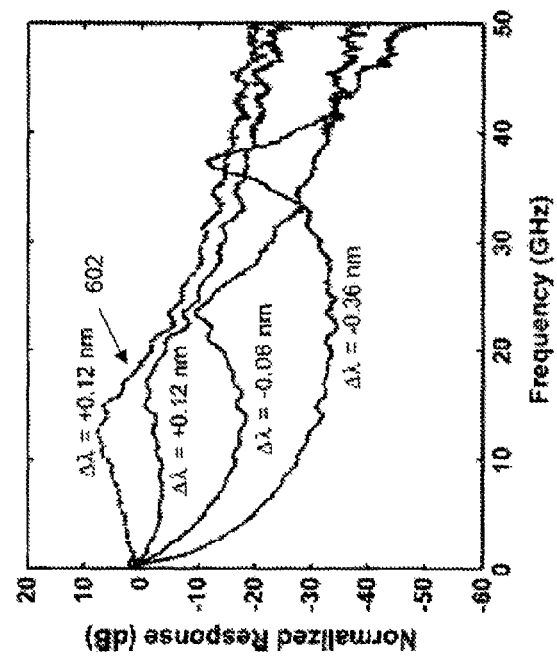
FIG. 6 is an example graph of a normalized frequency response of a slave laser under external injection for varying wavelength detuning for the exemplary semiconductor light-emitting device shown in FIG. 5, according to an embodiment of the present invention.

FIG. 6 is a graph of the modulation responses for the external injection (i.e., the external OIL configuration described above) for varying wavelength detuning. In FIG. 2, the slave gain current (for gain section 510-2) is 28 mA. The slave phase current (for phase section 508-2), front mirror current (for mirror 506-2) and rear mirror current (for mirror 506-1) are each set to 0 mA. As a reference, the free running modulation response of the slave laser is the dashed curve 802 in FIG. 8. By detuning the injected wavelength, the resonance frequency is increased from 3 GHz to 37 GHz. However, a dip at low frequencies limits the bandwidth. FIG. 6 shows this dip can be reduced by reducing the negative detuning and using positive detuning. Additionally, the laser bandwidth can be further increased to beyond 20 GHz by reducing the injected power as shown by the dashed curve 602 in FIG. 6.

The coupling of the laser cavities through the shared mirror 512 causes the cavity modes to be nondegenerate and prevents the lasers from sharing a free running wavelength. Therefore, single frequency operation is used as an indicator that the lasers are operating in the mutual injection locked regime as defined by a side mode suppression ratio of greater than 30 dB.

Figure 7:
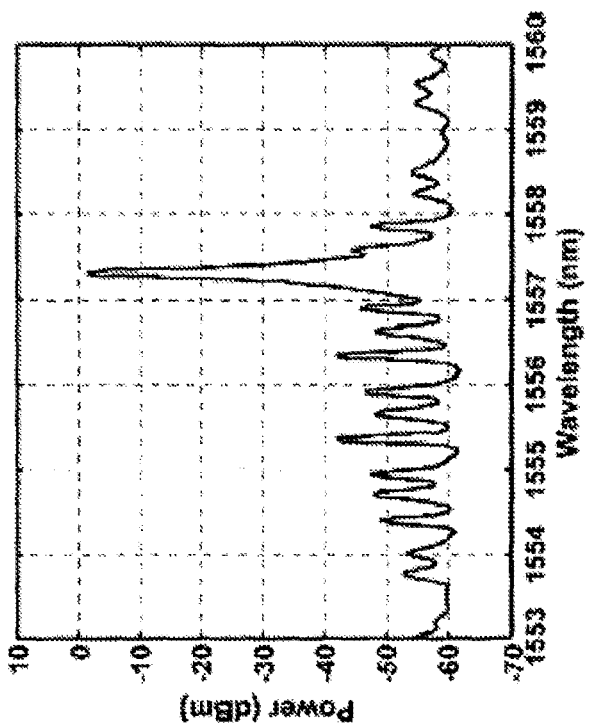
FIG. 7 is an example graph of output power as a function of wavelength under mutual injection locking for the exemplary semiconductor light-emitting device shown in FIG. 5, according to an embodiment of the present invention.

Due to the lack of optical isolation, there are three active cavities in device 502 resulting in a complex cavity mode spacing, which can be seen in the device spectra shown in FIG. 7. FIG. 7 is a graph of the spectra of (coupled cavity) device 502 at the output of slave laser 504-2. In the example shown in FIG. 7, the master gain current (for gain section 510-1) is 55 mA, the slave gain current is 31 mA, the slave phase current is 10 mA and the slave front mirror current is 1 mA. The shared mirror current (for mirror 512), the rear (master) mirror current and the master phase current (for phase section 508-1) are each set to 0 mA.

Applying current to the phase, mirror and gain regions (i.e., respective sections 508, 506, 512, 510) allows the relative cavity spacing and detuning to be altered. The detuning is measured as the difference between the peak wavelength and the nearest cavity mode seen in the spectra. Device 502 limits the mutual injection lock band to detuning values of −0.25 nm to −0.31 nm.

The small signal frequency response of example device 502 may be characterized using a 50 GHz network analyzer. The output of the network analyzer may be used to directly modulate the gain section 510-2 of the slave laser 504-2. Meanwhile, the gain section 510-1 of the master laser 504-1 may be biased at a constant current level. The light output of the device 502 is coupled into a lensed fiber (not shown), detected by a high speed photodiode (not shown) and the resulting electrical signal is directed to port 2 of the network analyzer. The small signal response of the free running slave laser may be taken by reverse biasing the master laser gain section as is done for the external OIL measurements.

Figure 8:
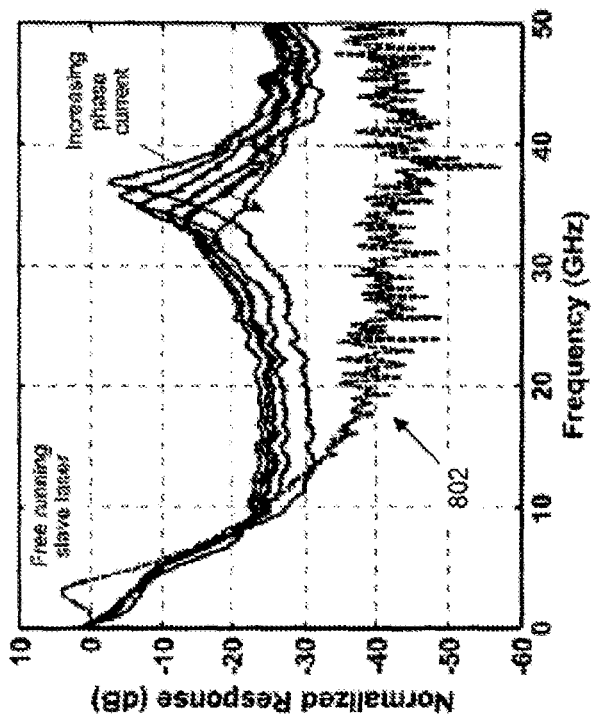
FIG. 8 is an example graph of a normalized frequency response under mutual injection locking for the exemplary semiconductor light-emitting device shown in FIG. 5, for varying levels of slave phase current, according to an embodiment of the present invention.

The normalized frequency response of the PIC under mutual injection locking is shown in FIG. 8. FIG. 8 is a graph of the small signal frequency response of the coupled cavity device 502 for various slave phase section currents (14 mA, 10 mA, 9 mA, 8 mA, 7 mA and 6 mA). In FIG. 8, the slave gain current is 31 mA, the master gain current is 55 mA and the slave front mirror current is 1 mA. Each of the shared mirror current, master phase current and the master rear mirror current is 0 mA. The different curves are for varying levels of the slave phase current, which changes the effective cavity length of the slave laser. As a result, the detuning between the free running wavelengths of the master and slave is altered. The resonance frequency closely correlates to the difference between the lasing wavelength and the nearest cavity mode seen in the optical spectra. The detuning decreases with increased phase current, moving the frequency resonance with it. The resonance is dampened as its frequency decreases.

Figure 9:
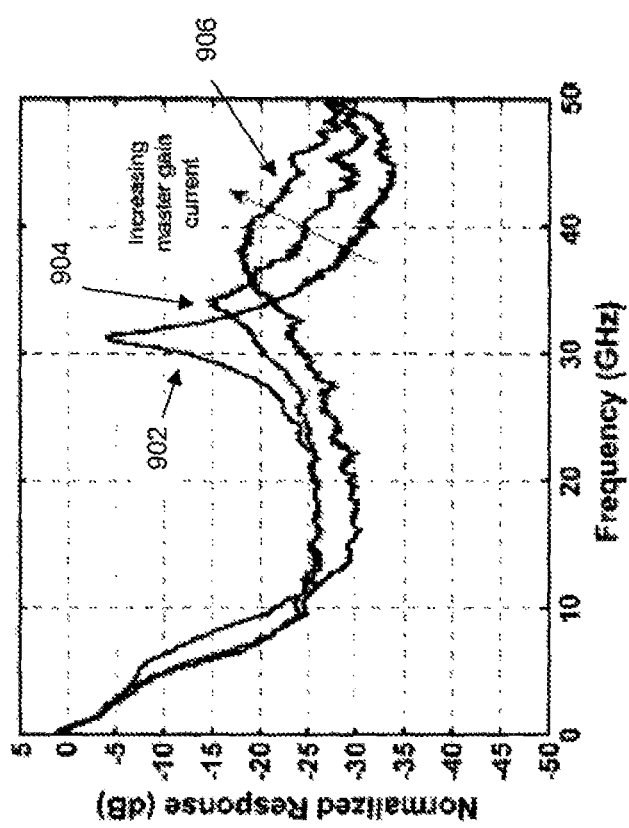
FIG. 9 is an example graph of a normalized frequency response under mutual injection locking for the exemplary semiconductor light-emitting device shown in FIG. 5, for varying levels of master laser gain current, according to an embodiment of the present invention.

Measurements of the mutual injection locked PIC are also taken for varying levels of master laser gain current. The resulting frequency response measurements are shown in FIG. 9. FIG. 9 is a graph of the small signal frequency response of the coupled cavity device 502 for various master laser gain currents (curve 902 represents 45 mA, curve 904 represents 55 mA and curve 906 represents 75 mA). In FIG. 9, the slave gain current is 31 mA, the slave phase current is 9.8 mA and the slave front mirror current is 1 mA. Each of the shared mirror current, master phase current and the master rear mirror current is 0 mA. The relaxation resonance moves out to beyond 30 GHz when the lasers are mutually injection locked. The resonance frequency continues to increase with increasing master laser current. This is in contrast to the modulation response curves in FIG. 8, where the relaxation resonance frequency increase is accompanied by a damping of the resonance. The damping in FIG. 5 is attributed to increased photon density in the modulated slave laser 504-2. A same trend may also be observed in the two 0.12 nm detuning curves for the external OIL system (FIG. 6).

Example 2

Referring to FIG. 10, a micrograph is shown of example semiconductor light-emitting device 1002 (referred to herein as device 1002) of PIC 1000. Device 1002 is similar to device 300 (FIGS. 3 and 4). Example device 1002 includes two DBR lasers (first and second lasers 1004-1, 1004-2) and a 200 μm-long EAM 1008 fabricated on an InP-based integration platform. Although there is not a clearly defined master and slave laser due to coupling between lasers 1004-1, 1004-2, for reference purposes the laser farthest from the front facet (first laser 1004-1) will be referred to as the master laser and the laser closest to the facet (second laser 1004-2) is referred to as the slave laser.

The example master laser 1004-1 consists of a 150 μm-long rear mirror 1010-1, a 50 μm-long phase section 1014-1, a 500 μm-long gain section 1016-1 and a 30 μm-long front mirror 1012-1. The example slave laser 1004-2 consists of a 30 μm-long rear mirror 1010-2, a 50 μm-long phase section 1014-2, a 200 μm-long gain section 1016-2 and a 58 μm-long front mirror 1012-2. The example mirrors are designed for 99%, 55%, 55% and 90% reflectivities for the master rear mirror 1010-1, master front mirror 1012-1, slave rear mirror 1010-1 and slave front mirror 1012-2, respectively. An example 4 μm-wide ridge waveguide (including waveguide section 1006) guides the light and connects all the circuit elements.

Metal-organic chemical vapor deposition (MOCVD) is used to grow epitaxial base structure for this chip 1000. Chip 1000 includes a seven quantum well active region centered in an InGaAsP waveguide layer. The active, passive and intermediate EAM band-edges are defined using a quantum well intermixing process. Following grating definition, there is a single, planar MOCVD regrowth of the p-doped cladding and InGaAs p-contact layers. Following fabrication, the output facet is coated with a single layer anti-reflection coating.

The bandwidth of the device may be measured using a 50 GHz network analyzer (not shown). The output from the network analyzer drives the EAM 1008. A 50Ω load resistor on the probe may be placed in parallel with the EAM 1008 for impedance matching. Current biases of gain sections 1016, phase sections 1014 and mirror sections 1010, 1012 may be optimized to obtain single mode operation, which indicates mutual injection locking of the master and slave lasers. The only inputs to the chip 1000 are DC electrical biases and the electrical modulation signal. The output of device 1002 is coupled into a lensed fiber (not shown) and detected by a high-speed photodetector (not shown) connected to the input of the network analyzer. The bandwidth of the EAM 1008 by itself may be taken as a reference from a separate device (not shown) consisting of a DBR laser and an EAM (at the output) (the combination of the DBR laser and EAM being referred to herein as an EML chip). To ensure that the modulated power is similar, the laser on the EML chip may be biased to achieve the same photocurrent as the injection locked device 1002. The direct modulation bandwidth of the slave laser 1004-2 is taken with a 4 V reverse bias on the EAM to suppress feedback from the cavity of master laser 1004-1.

Figure 11:
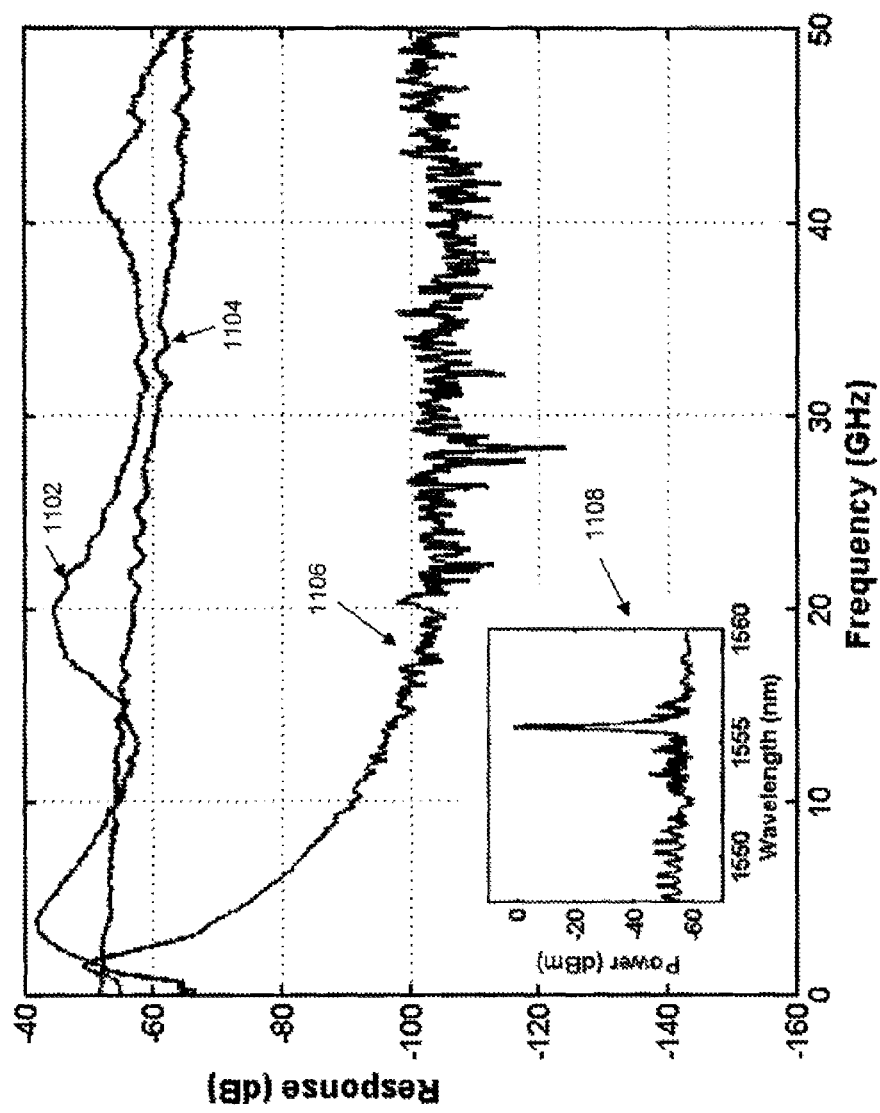
FIG. 11 is an example graph of a normalized frequency response under mutual injection locking for the exemplary semiconductor light-emitting device shown in FIG. 10, according to an embodiment of the present invention.

FIG. 11 is a graph of the small signal response of device 1002 of FIG. 10 (curve 1102), the EML chip (curve 1104) and the slave laser 1004-2 under direct modulation (curve 1106). In FIG. 11, for curve 1102 (i.e., for device 1002 of FIG. 10 with EAM 1008 between the two lasers), the slave gain current (of gain region 1016-2) is 35 mA, the master gain current (of gain region 1016-1) is 72 mA and the voltage of EAM 1008 is −1.5 V. For curve 1104 (i.e., for the EML chip with an EAM at the output of the DBR laser), the voltage of the EAM is −1.5 V. For curve, 1106, the slave gain current is 35 mA. Inset 1108 illustrates the optical spectrum of device 1002 (FIG. 10). Curve 1102 illustrates that device 1002 (FIG. 10) with the EAM 1008 under modulation has a bandwidth extending beyond the 50 GHz measurement capabilities of the network analyzer. This is an improvement over the 10 GHz and 2.5 GHz bandwidths demonstrated by the integrated DBR-EAM (curve 1104) and directly modulated slave laser (curve 1106), respectively.

It has been shown that the modulation sideband interaction with the free running laser cavity modes is responsible for the resonance frequency enhancements. Because there are no isolators involved in device 1002 (FIG. 10), device 1002 consists of five coupled active laser cavities leading to closely spaced cavity mode spacing. These closely spaced modes may be responsible for the multiple response enhancements seen in the frequency response of curve 1102. In FIG. 11, the plotted frequency responses are not normalized and the same output modulation power level is used for all testing. Therefore, the relative amplitudes of the frequency responses show that the injection-locked device 1002 (FIG. 10) (curve 1102) has a higher modulation efficiency compared to the EAM (curve 1104) alone.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A semiconductor light-emitting device comprising:
a first laser section monolithically integrated with a second laser section on a common substrate, each laser section having a phase section, a gain section and at least one distributed Bragg reflector (DBR) structure, wherein:
the first laser section and the second laser section are optically coupled to permit optical feedback therebetween;
each phase section is configured to independently tune a respective one of the first and second laser sections relative to the other;
for each laser section, the at least one DBR structure includes two DBR structures such that the phase section and the gain section are disposed between the two DBR structures; and
the semi-conducting light-emitting device further includes an intensity modulation section monolithically integrated between the first laser section and the second laser section.

2. The semiconductor light-emitting device according to claim 1, wherein the first laser section and the second laser section are configured or configurable to be mutually injection locked.

3. The semiconductor light-emitting device according to claim 1, further including an independent electrical contact coupled to each phase section, for applying a respective current to each phase section to adjust a resonance frequency of the semiconductor light-emitting device.

4. The semiconductor light-emitting device according to claim 1, further including an independent electrical contact coupled to each gain section, for applying a respective injection current to each gain section.

5. The semiconductor light-emitting device according to claim 1, further including an independent electrical contact coupled to each DBR structure, for applying a respective current to each DBR structure to adjust a resonance frequency of the semiconductor light-emitting device.

6. The semiconductor light-emitting device according to claim 1, wherein each laser section includes an active region, the active region including at least one of quantum dots, at least one quantum well, or a single bulk active layer.

7. The semiconductor light-emitting device according to claim 1, further including an electrical contact coupled to the intensity modulation section, for applying an electrical signal to the intensity modulation section to control an amount of optical coupling between the first laser section and the second laser section.

8. The semiconductor light-emitting device of claim 1, wherein the intensity modulation section comprises an electro-absorption modulator (EAM).

9. A method of forming a semiconductor light-emitting device comprising:
forming a waveguide layer on a substrate, the waveguide layer having an optical region; and
forming a first laser section and a second laser section in the waveguide layer such that the first laser section and the second laser section share the optical region, each laser section being formed to include a phase section, a gain section and at least one distributed Bragg reflector (DBR) structure, wherein:

the gain sections of the respective first and second laser sections are formed noncontiguously;

each said gain section is formed within one of two distinct optical cavities respectively denominated the first and second optical cavities;

the first and second optical cavities are optically coupled and at least a third optical cavity is formed that contains the first and second optical cavities;

the first laser section and the second laser section are formed with optical coupling between them of sufficient strength to permit optical feedback therebetween and joint optical resonance among at least said first, second, and third optical cavities; and each phase section is configured to independently tune, in optical frequency, a respective one of the first and second laser sections relative to the other;

for each laser section, forming the at least one DBR structure includes forming two DBR structures such that the phase section and the gain section are disposed between the two DBR structures; and the method further includes, for each laser section, forming an intensity modulation section between the first laser section and the second laser section in the waveguide layer.

10. The method according to claim 9, further including, forming an electrical contact for the intensity modulation section.

11. The method according to claim 9, wherein the intensity modulation section comprises an electro-absorption modulator (EAM).

12. A method of optical injection locking comprising:

providing a first laser section monolithically integrated with a second laser section on a common substrate, each laser section having a phase section, a gain section and at least one distributed Bragg reflector (DBR) structure, selecting an amount of optical coupling between the first laser section and the second laser section to permit optical feedback therebetween;

applying a bias current to each of the first laser section and the second laser section to establish a mutual injection locking mode of a kind that lacks any distinct master laser section or slave laser section, such that one laser section of the first laser section and the second laser section directly modulates the remaining laser section and the remaining laser section emits light; and independently applying a current to each phase section to modify respective effective cavity lengths of the first laser section and the second laser section relative to each other, for adjusting a resonance frequency of the emitted light, wherein the selecting of the amount of optical coupling includes modulating the optical coupling between the first and second laser by applying an electrical signal to an intensity modulator disposed between the first laser section and the second laser section.

13. The method according to claim 12, the method further including for each laser section applying a current to the at least one DBR structure to adjust the resonance frequency.

14. The method according to claim 12, wherein the selecting of the amount of optical coupling includes selectively controlling a reflectivity of a further DBR structure disposed between the first laser section and the second laser section.

15. The method according to claim 12, wherein the intensity-modulating electrical signal is a voltage applied to an electro-absorption modulator (EAM).

* * * * *